(12) United States Patent
Kolics et al.

(10) Patent No.: US 9,875,968 B2
(45) Date of Patent: Jan. 23, 2018

(54) INTERLEVEL CONDUCTOR PRE-FILL UTILIZING SELECTIVE BARRIER DEPOSITION

(71) Applicant: Lam Research Corporation, Fremont, CA (US)

(72) Inventors: Artur Kolics, Dublin, CA (US); William T. Lee, Dublin, CA (US); Larry Zhao, Lake Oswego, OR (US); Derek Wong, San Jose, CA (US); Praveen Nalla, Fremont, CA (US); Kaihan Ashtiani, San Jose, CA (US); Patrick A. Van Cleemput, San Jose, CA (US); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/442,307

(22) Filed: Feb. 24, 2017

(65) Prior Publication Data

US 2017/0162512 A1 Jun. 8, 2017

Related U.S. Application Data

(62) Division of application No. 14/874,307, filed on Oct. 2, 2015, now Pat. No. 9,583,386.

(Continued)

(51) Int. Cl.
*H01L 21/768* (2006.01)
*H01L 23/532* (2006.01)
(Continued)

(52) U.S. Cl.
CPC .. *H01L 23/53238* (2013.01); *H01L 21/02063* (2013.01); *H01L 21/288* (2013.01);
(Continued)

(58) Field of Classification Search
CPC ......... H01L 23/53238; H01L 21/76874; H01L 21/7684; H01L 21/76879; H01L 21/76846;
(Continued)

(56) References Cited

U.S. PATENT DOCUMENTS

2008/0182409 A1* 7/2008 Seidel ............... H01L 21/76843
438/678

* cited by examiner

*Primary Examiner* — Thanhha Pham
(74) *Attorney, Agent, or Firm* — Martine Penilla Group, LLP (57) ABSTRACT

A substrate is provided having a dual damascene structure formed within a dielectric material over the substrate. The dual damascene structure includes a trench and an opening formed to extend from a bottom of the trench to an underlying conductive material, with the underlying conductive material exposed at a bottom of the opening. The dual damascene structure is exposed to a sealing process by which the exposed surfaces of the dielectric material in the opening are sealed without covering the underlying conductive material exposed at the bottom of the opening. The sealing process can be one or more of deposition of a flowable film, deposition of an amorphous carbon barrier layer, and formation of a self-assembled monolayer of an amino group. After the sealing process, an electroless deposition process is performed to fill the opening with a metallic material in a bottom-to-top manner up to the bottom of the trench.

19 Claims, 10 Drawing Sheets

Related U.S. Application Data (60) Provisional application No. 62/068,626, filed on Oct. 25, 2014.

(51) Int. Cl.
  *H01L 21/285* (2006.01)
  *H01L 21/02* (2006.01)
  *H01L 21/288* (2006.01)
  *H01L 23/528* (2006.01)
  *H01L 23/522* (2006.01)

(52) U.S. Cl.
  CPC ...... *H01L 21/2855* (2013.01); *H01L 21/2885* (2013.01); *H01L 21/28556* (2013.01); *H01L 21/28568* (2013.01); *H01L 21/7684* (2013.01); *H01L 21/76807* (2013.01); *H01L 21/76831* (2013.01); *H01L 21/76846* (2013.01); *H01L 21/76873* (2013.01); *H01L 21/76874* (2013.01); *H01L 21/76879* (2013.01); *H01L 23/528* (2013.01); *H01L 23/5226* (2013.01); *H01L 23/53204* (2013.01)

(58) Field of Classification Search
  CPC ......... H01L 21/76831; H01L 21/76807; H01L 21/28568; H01L 21/288
  See application file for complete search history.

INTERLEVEL CONDUCTOR PRE-FILL UTILIZING SELECTIVE BARRIER DEPOSITION

CLAIM OF PRIORITY

This application is a divisional application under 35 U.S.C. 121 of U.S. patent application Ser. No. 14/874,307, filed on Oct. 2, 2015, which claims priority under 35 U.S.C. 119(e) to U.S. Provisional Patent Application No. 62/068,626, filed Oct. 25, 2014. The disclosure of each above-identified patent application is incorporated herein by reference in its entirety for all purposes.

BACKGROUND OF THE INVENTION

Field of the Invention

The invention relates to methods for manufacturing semiconductor devices. More specifically, the invention relates to formation of electrically conductive interconnects through one or more dielectric material layers.

Description of Related Art

Semiconductor devices are formed in a multi-level arrangement with electrically conductive structures in different levels insulated from each other by one or more intervening levels of dielectric material. Required electrical connectivity between conductive structures in different levels is provided by interlevel conductors, such as vias and contacts, that extend through the dielectric material. As semiconductor devices continue to scale downward in size, the aspect ratio (i.e., ratio of height to width) of the interlevel conductors becomes greater, even to the point where uniformity in material presence and/or density of the interlevel conductor is difficult to achieve. It is within this context that the present invention arises.

SUMMARY OF THE INVENTION

A method is disclosed for manufacturing a semiconductor device. The method includes providing a substrate having at least one dual damascene structure formed within a dielectric material over the substrate. The at least one dual damascene structure includes a trench and an opening formed to extend from a bottom of the trench to an underlying conductive material, such that the underlying conductive material is exposed at a bottom of the opening. The method also includes exposing the at least one dual damascene structure to a flowable film for a period of time that is less than a time required for nucleation of the flowable film to occur on the underlying conductive material and that is greater than a time required for nucleation of the flowable film to occur on exposed surfaces of the dielectric material, such that the flowable film deposits on exposed surfaces of the dielectric material in the opening without depositing on the underlying conductive material exposed at the bottom of the opening. The flowable film is deposited on the exposed surfaces of the dielectric material to form a sealing barrier layer. The method also includes performing a cleaning process on the substrate, with structures formed thereon, to remove material residues left over from the deposition of the flowable film to form the sealing barrier layer. The method further includes performing an electroless deposition process to fill the opening with a metallic material in a bottom-to-top manner up to the bottom of the trench. The electroless deposition process initiates on the underlying conductive material exposed at the bottom of the opening.

A method is disclosed for manufacturing a semiconductor device. The method includes providing a substrate having at least one dual damascene structure formed within a dielectric material over the substrate. The at least one dual damascene structure includes a trench and an opening formed to extend from a bottom of the trench to an underlying conductive material, such that the underlying conductive material is exposed at a bottom of the opening. The method also includes forming an amorphous carbon barrier layer on each sidewall of the opening without covering the underlying conductive material exposed at the bottom of the opening. The method also includes performing a cleaning process on the substrate, with structures formed thereon, to remove material residues left over from formation of the amorphous carbon barrier layer. The method further includes performing an electroless deposition process to fill the opening with a metallic material in a bottom-to-top manner up to the bottom of the trench. The electroless deposition process initiates on the underlying conductive material exposed at the bottom of the opening.

A method is disclosed for manufacturing a semiconductor device. The method includes providing a substrate having at least one dual damascene structure formed within a dielectric material over the substrate. The at least one dual damascene structure includes a trench and an opening formed to extend from a bottom of the trench to an underlying conductive material, such that the underlying conductive material is exposed at a bottom of the opening. The method also includes forming a self-assembled monolayer of an amino group on each sidewall of the opening without covering the underlying conductive material exposed at the bottom of the opening. The method also includes performing a cleaning process on the substrate, with structures formed thereon, to remove material residues left over from formation of the self-assembled monolayer. The method further includes performing an electroless deposition process to fill the opening with a metallic material in a bottom-to-top manner up to the bottom of the trench. The electroless deposition process initiates on the underlying conductive material exposed at the bottom of the opening.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
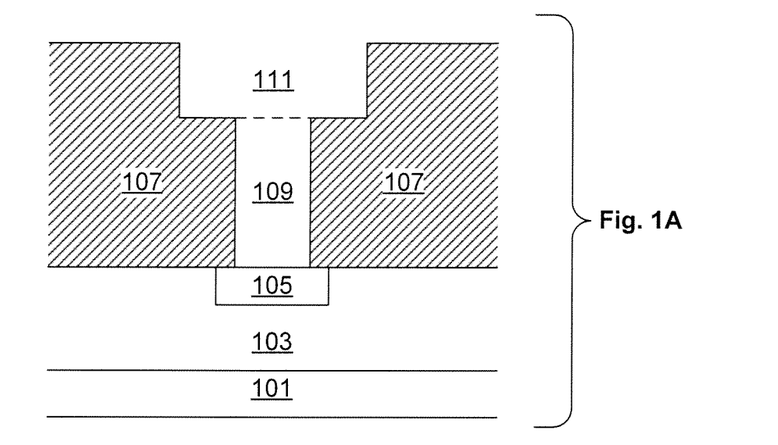
FIG. 1A shows a substrate having a dual damascene structure formed in a dielectric material over the substrate.

FIG. 1A shows a substrate 101 having a dual damascene structure formed in a dielectric material 107 over the substrate 101. As used herein, in some embodiments the term "substrate" refers to a semiconductor wafer. However, it should be understood that in other embodiments, the term "substrate" as used herein can refer to substrates formed of sapphire, GaN, GaAs or SiC, or other substrate materials, and can include glass panels/substrates, metal foils, metal sheets, polymer materials, or the like. Also, in various embodiments, the term "substrate" as used herein may vary in form, shape, and/or size. For example, in some embodiments, the term "substrate" as used herein may correspond to a 200 mm (millimeters) semiconductor wafer, a 300 mm semiconductor wafer, or a 450 mm semiconductor wafer, or a semiconductor wafer of another size. Also, in some embodiments, the term "substrate" as used herein may correspond to a non-circular substrate, such as a rectangular substrate for a flat panel display, or the like, among other shapes. The "substrate" referred to herein is denoted in the various example embodiment figures as substrate 101.

In the fabrication of semiconductor devices such as integrated circuits, memory cells, and the like, a series of manufacturing operations are performed to define features in a multi-level manner on and above the substrate 101. For example, integrated circuits are formed by multi-level structures defined on a silicon substrate. At a substrate level, transistor devices with diffusion regions and gate electrode conductors are formed. In higher levels above the substrate level, interconnect metallization lines are patterned and electrically connected to the transistor devices to define a desired integrated circuit device. Also, patterned conductive structures/layers are insulated from other conductive structures/layers by dielectric materials. In FIG. 1A, some of these one or more layers built upon the substrate 101 to form the integrated circuit, or portion thereof, are represented by layer 103. At an upper location of the layer 103, an electrically conductive material 105 is present. The dual damascene structure formed in the dielectric material 107 includes a trench region 111 ("trench" hereafter) and an opening 109 formed to extend from a bottom of the trench 111 to the underlying conductive material 105, such that the underlying conductive material is exposed at a bottom of the opening 109. The trench 111 and the opening 109 are to be filled with an electrically conductive material in order to make an electrical connection between the underlying conductive material 105 and another higher-level conductor within the integrated circuit.

In some embodiments, the dielectric material 107 is a low-k dielectric material. In some embodiments, the low-k dielectric material is porous. Also, in some embodiments, the low-k dielectric material is characterized by having a dielectric constant of less than 4.0. Examples of low-k dielectric material that can be used as the dielectric material 107 include without limitation, Black Diamond™ from Applied Materials of Santa Clara, Calif.; Aurora™ from ASM International N.V. of The Netherlands; Sumika Film™ from Sumitomo Chemical America, Inc., Santa Clara, Calif.; HOSP™ from Allied Signal of Morristown, N.J.; SiLK™ or advanced porous SiLK from DOW Chemical Company; Orion™ Flowfill™ from Trikon; and LKD™ from JSR Corporation. Additionally, in some embodiments the dielectric material 107 is porous organosilicate glass (OSG), which is a low-k dielectric material. It should be understood that the dielectric material 107 referred to herein is not limited to the example low-k dielectric materials listed above, and can be formed of essentially any other dielectric material or low-k dielectric material.

Figure 1B:
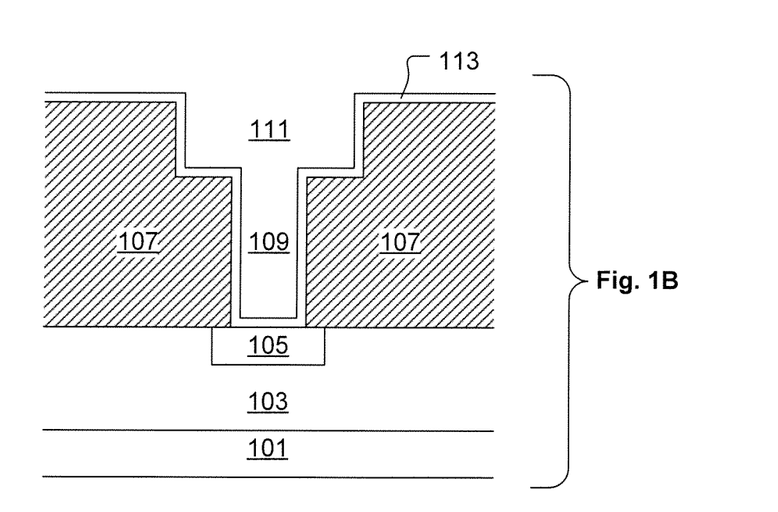
FIG. 1B shows the configuration of FIG. 1A with a barrier layer conformally deposited on the dielectric material.
Figure 1C:
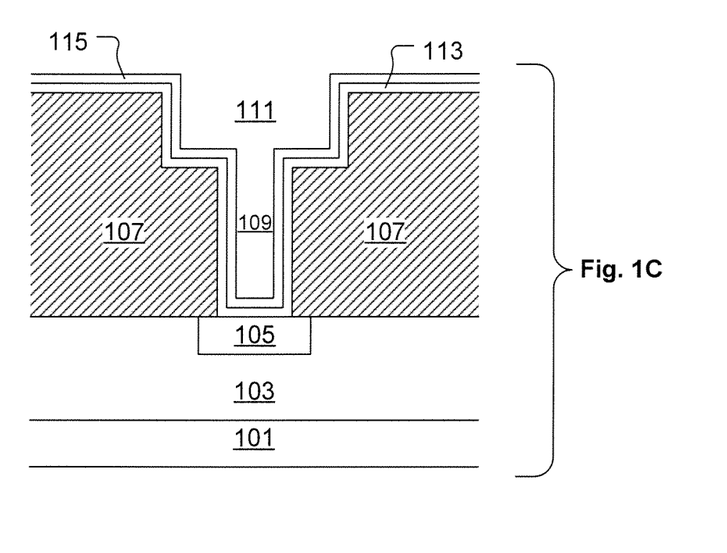
FIG. 1C shows the configuration of FIG. 1B with a liner layer conformally deposited on the barrier layer.
Figure 1D:
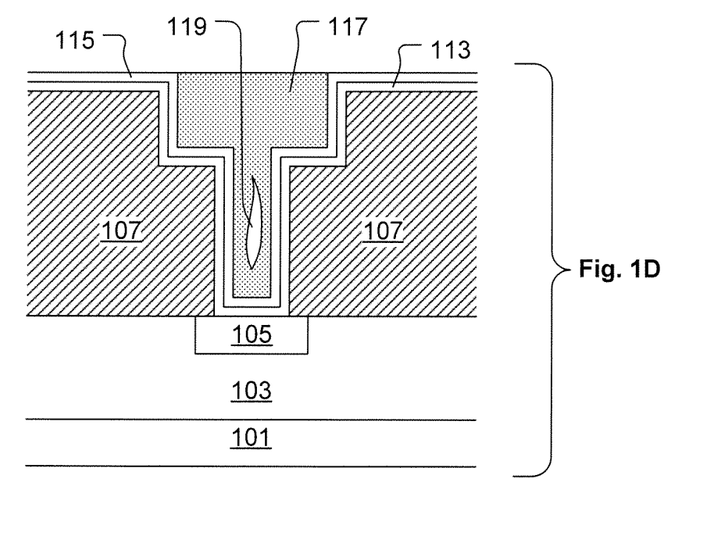
FIG. 1D shows the configuration of FIG. 1C following deposition of the Cu seed layer and bulk filling of the opening and trench with Cu and following performance of a planarization process, such as a chemical mechanical planarization (CMP) process.

FIG. 1B shows the configuration of FIG. 1A with a barrier layer 113 conformally deposited on the dielectric material. In some embodiments, the barrier layer is formed by a tantalum nitride (TaN) material deposited through either a physical vapor deposition (PVD) process or an atomic layer deposition (ALD) process. FIG. 1C shows the configuration of FIG. 1B with a liner layer 115 conformally deposited on the barrier layer 113. In some embodiments, the liner layer 115 is formed through PVD of tantalum (Ta), or through chemical vapor deposition (CVD) of cobalt (Co), or through CVD of ruthenium (Ru). Following deposition of the liner layer 115, a copper (Cu) seed layer is deposited on the liner layer 115. Then, the opening 109 and trench 111 is filled with Cu. FIG. 1D shows the configuration of FIG. 1C following deposition of the Cu seed layer and bulk filling of the opening 109 and trench 111 with Cu 117, and following performance of a planarization process, such as a chemical mechanical planarization (CMP) process. In practice, the bulk filling of the opening 109 and trench 111 with Cu 117 results in an overfill of Cu that is subsequently removed through a planarization process, such as the CMP process, so as to leave a top surface of the Cu 117 substantially even with a top level of the trench 111.

In some embodiments, the opening 109 is formed to have a high aspect ratio, i.e., a high ratio of the opening height to the opening width. For example, in some embodiments, the aspect ratio of the opening 109 can be within range extending from about 1:1 to about 60:1. At a technology node of 32 nm, the aspect ratio of the opening 109 may be at least 6:1. When the aspect ratio of the opening 109 becomes sufficiently high, during the bulk filling of the opening 109 with Cu, the build up of Cu from the sidewalls of the opening 109 can outpace the build up of Cu from the bottom of the opening 109 so as to leave a void 119. Such voids 119 are undesirable because they adversely increase the overall electrical resistance of the Cu structure formed within the opening 109. Additionally, the presence of the barrier layer 113 material and the liner layer 115 material at the bottom of the opening 109 can also adversely increase the overall electrical resistance between the underlying conductive material 105 and the Cu within the trench 111. It should be appreciated that as integrated circuit device sizes continue to scale downward, the aspect ratio of features such as the opening 109 increases, which further exacerbates the issues associated with increased electrical resistance and void formation when fabricating interlevel conductive structures. Therefore, it is an objective of the present invention to provide methods for filling the opening 109 with metal so as to avoid having the barrier layer 113 material and the liner layer 115 material present at the bottom of the opening 109, and so as to prevent formation of voids within the finished metal structure within the opening 109.

Figure 2A:
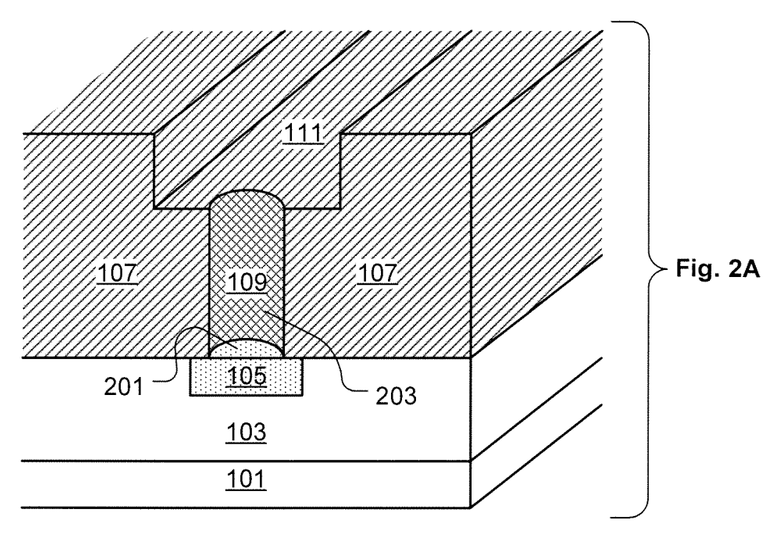
FIG. 2A shows an isometric view of the configuration of FIG. 1A, in accordance with one embodiment of the present invention.

FIG. 2A shows an isometric view of the configuration of FIG. 1A, in accordance with one embodiment of the present invention. The dielectric material 107 has a dual damascene structure formed within it that includes the trench 111 and the opening 109 formed to extend from the bottom of the trench 111 to the underlying conductive material 105. A top surface 201 of the underlying conductive material 105 is exposed at the bottom of the opening 109. It should be understood that in various embodiments the opening 109 can be defined to form a via structure, or a contact structure, or essentially any other type of interlevel conductive structure used to provide an electrical connection between conductors within different levels of the semiconductor device, i.e., of the integrated circuit. The opening 109 has an exposed sidewall 203. In some embodiments, the opening 109 is substantially cylindrical in shape with a single continuous sidewall 203. In other embodiments, the opening 109 is rectilinearly shaped so as to have multiple sidewalls 203 of different angular orientation. The "sidewall" 203 of the opening 109 as mentioned herein refers to the exposed surface of the dielectric material 107 that is within the opening 109 which extends from the top of the opening 109 (located at the bottom of the trench 111) to the bottom of the opening 109 (located at the top of the underlying conductive material 105), regardless of the particular shape of the opening 109.

In many embodiments, the dielectric material 107 is a porous material, such as the porous low-k dielectric material, through which metal may diffuse rather easily. This is particularly true in the case of Cu being used to fill the opening 109 and trench 111. Diffusion of metal into the dielectric material 107 adversely affects the electrical insulating properties of the dielectric material 107, which in turn can adversely affect interconnect reliability and electrical performance of the integrated circuit. Therefore, it is necessary to provide a barrier to diffusion of metal into the exposed dielectric material 107 prior to filling of the opening 109 and trench 111 with metal. Also, once formed, the barrier to diffusion of metal that is provided over the dielectric material 107 should remain stable and be able to withstand thermal stresses associated with subsequent semiconductor fabrication processes and be able to withstand electrical stresses associated with operation of the final as-fabricated integrated circuit.

Figure 2B:
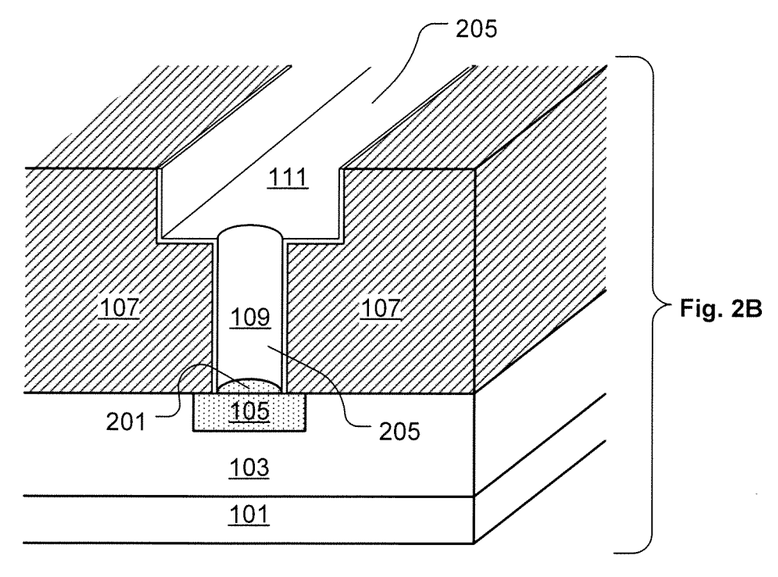
FIG. 2B shows the configuration of FIG. 2A with a sealing barrier formed on exposed surfaces of the dielectric material within both the opening and the trench, in accordance with one embodiment of the present invention.

FIGS. 2B-2G illustrate methods by which the opening 109 and the trench 111, formed as part of the dual damascene structure within the dielectric material 107 of FIG. 2A, can be filled with metal without having a barrier material or a liner material present at the bottom of the opening 109 and without having voids formed as the opening 109 is filled with metal, in accordance with various embodiments of the present invention. FIG. 2B shows the configuration of FIG. 2A with a sealing barrier 205 formed on exposed surfaces of the dielectric material 107 within both the opening 109 and the trench 111, in accordance with one embodiment of the present invention. More specifically, the sealing barrier 205 is formed on the sidewall 203 of the opening 109 without covering the top surface 201 of the underlying conductive material 105 present at the bottom of the opening 109. A sealing process used to form the sealing barrier 205 is selective to the dielectric material 107 present on the sidewall of the opening 109 and within the trench 111, such that the sealing barrier 205 does not cover the exposed top surface 201 of the underlying conductive material 105. In various embodiments, the sealing barrier 205 can be formed by one or more of deposition of a flowable film (such as a nitride film, or a carbide film, or an oxide film, or a combination thereof), deposition of an amorphous carbon barrier, and formation of a self-assembled monolayer (SAM) of an amino group. In some embodiments, deposition of the amorphous carbon sealing barrier 205 layer can be performed by a plasma-enhanced chemical vapor deposition (PECVD) process, or by other deposition processes that utilize an inductively-coupled plasma, or by other deposition processes that utilize a capacitively-coupled plasma, or by other deposition processes that utilize a transformer-coupled plasma, or by deposition processes that utilize a remotely generated plasma relative to the substrate. Also, in some embodiments, deposition of the amorphous carbon sealing barrier 205 layer can include deposition of one or more of a number of different carbon-containing materials, such as C+N, C+B, among others. After the sealing process used to form the sealing barrier 205 layer is completed, a cleaning process can be performed to remove any potential material residues left over from the sealing process.

Figure 2C:
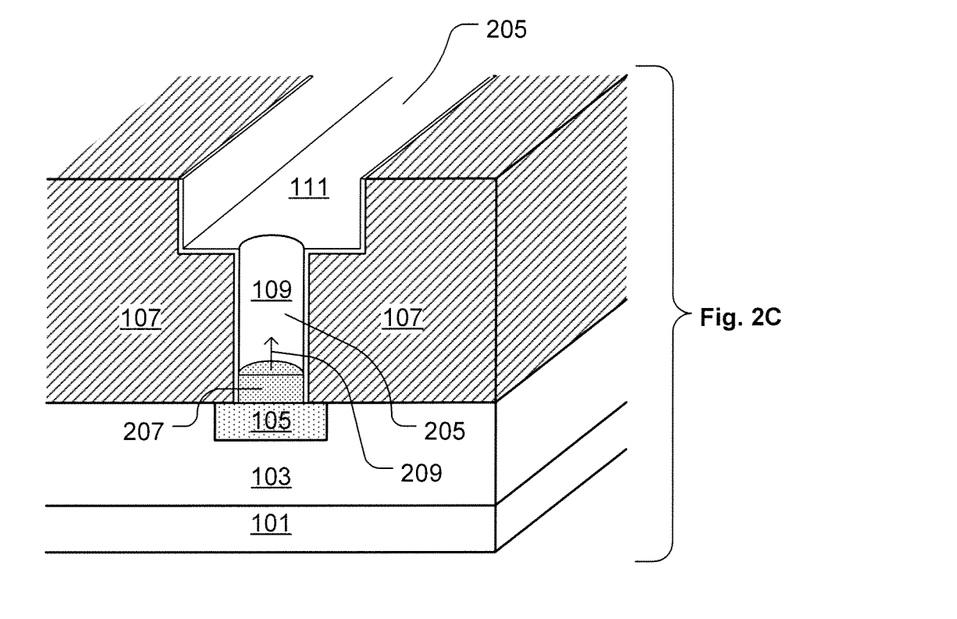
FIG. 2C shows the configuration of FIG. 2B after initiation of an electroless deposition (ELD) process to fill the opening with metal, in accordance with one embodiment of the present invention.

FIG. 2C shows the configuration of FIG. 2B after initiation of an electroless deposition (ELD) process to fill the opening 109 with metal 207, in accordance with one embodiment of the present invention. The exposed top surface 201 of the underlying conductive material 105 is used to initiate nucleation for the deposition reaction in the ELD process. Therefore, deposition of the metal 207 in the opening 109 begins on the exposed top surface 201 of the underlying conductive material 105 and progresses in a substantially uniform bottom-to-top manner up through the opening 109 to the bottom of the trench 111, as indicated by arrow 209. The ELD process is selective to the underlying conductive material 105 and the metal 207 itself, such that nucleation for the deposition reaction in the ELD process is essentially non-existent and/or suppressed on the exposed surface of the sealing barrier 205. This provides for the substantial uniformity in filling of the opening 109 with the metal 207 in the bottom-to-top manner. In various embodiments, the metal 207 can be cobalt (Co), copper (Cu), or nickel (Ni). In other embodiments, the metal 107 can be an element other that Co, Cu, or Ni, or the metal 107 can be a combination of elements including or excluding Co, Cu, and/or Ni. Also, in some embodiments, the underlying conductive material 105 and the metal 207 are of a same material. And, in some embodiments, the underlying conductive material 105 and the metal 207 are different materials. It should be understood that the sealing barrier 205 prevents the metal 207 from diffusing into the dielectric material 107.

Figure 2D:
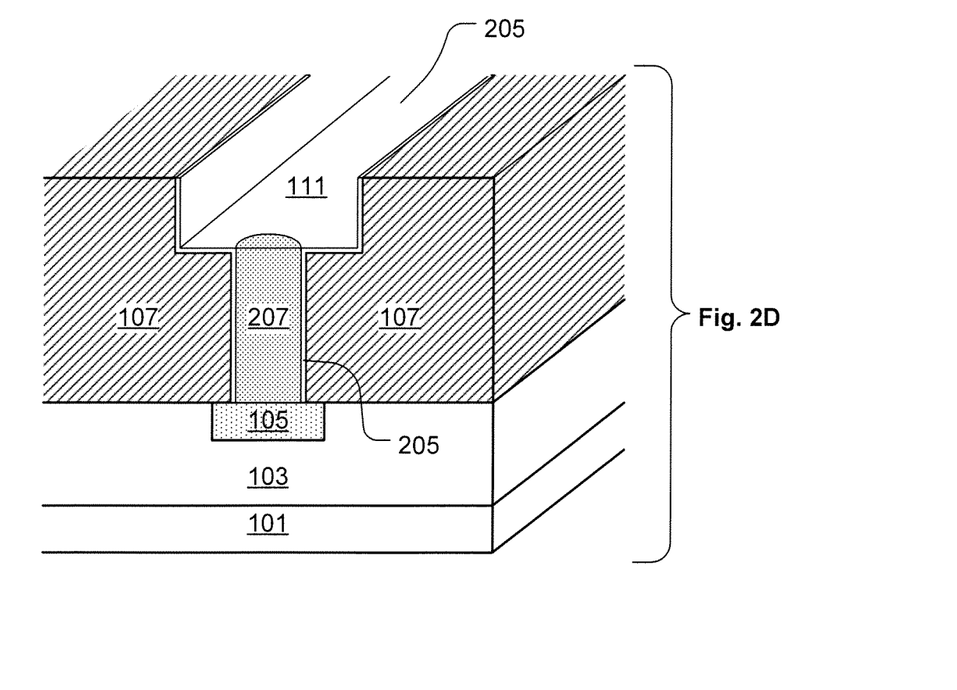
FIG. 2D shows the configuration of FIG. 2C after completion of the ELD process to fill the opening with metal, in accordance with one embodiment of the present invention.

FIG. 2D shows the configuration of FIG. 2C after completion of the ELD process to fill the opening 109 with metal 207, in accordance with one embodiment of the present invention. It should be understood that the because the ELD process fills the opening 109 in a substantially uniform bottom-to-top manner, it is possible to detect and/or predict when the metal 207 reaches the top of the opening 109, i.e., reaches the bottom of the trench 111, at which point the ELD process is stopped.

Figure 2E:
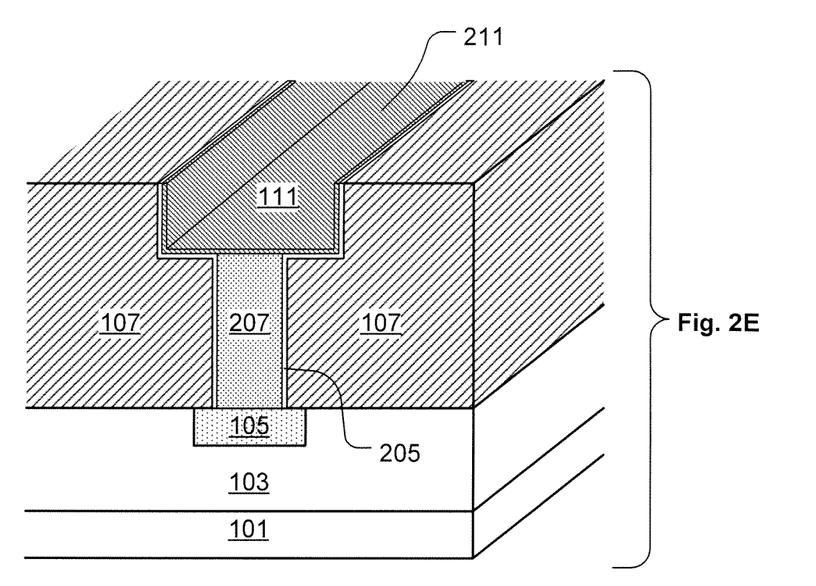
FIG. 2E shows the configuration of FIG. 2D with a barrier material conformally deposited to cover exposed surfaces of the trench, i.e., of the sealing barrier within the trench, and the exposed surface of the metal that fills the opening, in accordance with one embodiment of the present invention.

FIG. 2E shows the configuration of FIG. 2D with a barrier material 211 conformally deposited to cover exposed surfaces of the trench 111, i.e., of the sealing barrier 205 within the trench 111, and the exposed surface of the metal 207 that fills the opening 109, in accordance with one embodiment of the present invention. In some embodiments, the barrier material 211 is tantalum nitride (TaN). In some embodiments, the barrier material 211 is deposited through a physical vapor deposition (PVD) process. In some embodiments, the barrier material 211 is deposited through a chemical vapor deposition (CVD) process. In some embodiments, the barrier material 211 is deposited through an atomic layer deposition (ALD) process. However, it should be understood that in other embodiments, the barrier material 211 can be a material other than TaN, and may be deposited through a process other than PVD or CVD or ALD, so long as the barrier material 211 is suitable for receiving a subsequent deposition of a liner material.

Figure 2F:
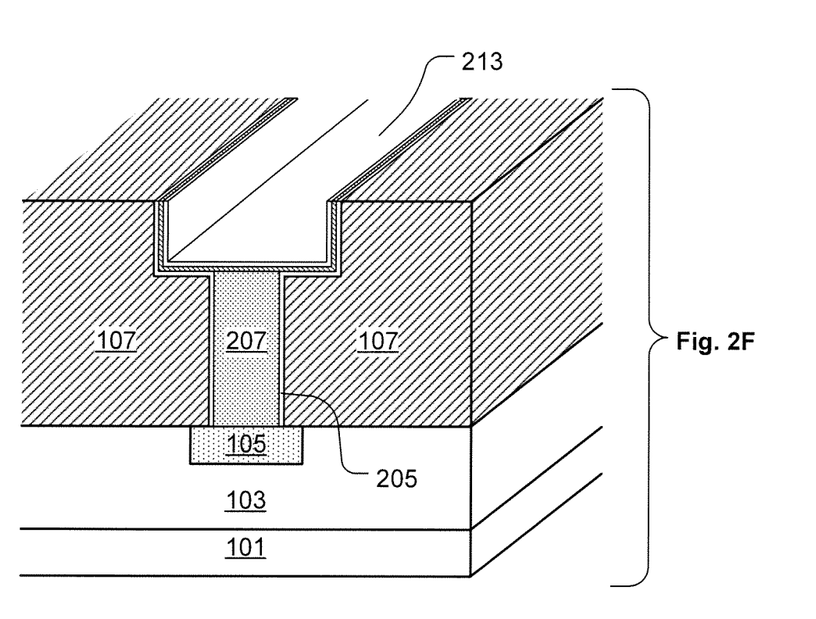
FIG. 2F shows the configuration of FIG. 2E with a liner material conformally deposited to cover the barrier material within the trench, in accordance with one embodiment of the present invention.

FIG. 2F shows the configuration of FIG. 2E with a liner material 213 conformally deposited to cover the barrier material 211 within the trench 111, in accordance with one embodiment of the present invention. In some embodiments, the liner material 213 is tantalum (Ta) deposited by a PVD process. In some embodiments, the liner material 213 is cobalt (Co) deposited by a CVD process. In some embodiments, the liner material 213 is ruthenium (Ru) deposited by a CVD process. However, it should be understood that in other embodiments, the liner material 213 can be a material other than Ta, Co, or Ru, and may be deposited through a process other than PVD or CVD, so long a the liner material 213 is suitable for receiving a subsequent deposition of metal.

Figure 2G:
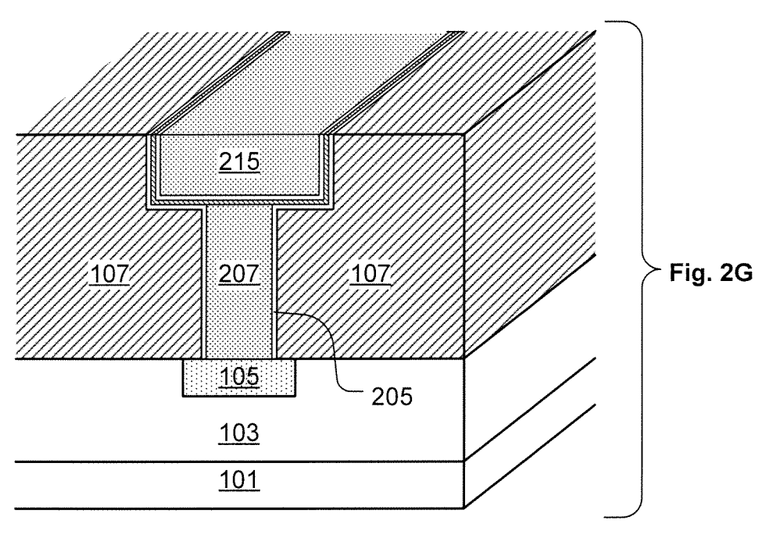
FIG. 2G shows the configuration of FIG. 2F after depositing a seed layer on the liner material in the trench and filling the trench with metal and following performance of a planarization process, such as a CMP process, in accordance with one embodiment of the present invention.

FIG. 2G shows the configuration of FIG. 2F after depositing a seed layer on the liner material 213 in the trench 111 and filling the trench 111 with metal 215 and following performance of a planarization process, such as a CMP process, in accordance with one embodiment of the present invention. In some embodiments, the seed layer is a copper (Cu) seed layer deposited to cover exposed surfaces of the liner material 213 in the trench 111. And, in some embodiments, the remainder of the trench 111 is filled with copper (Cu) by performing either an electroplating process or an ELD process. It should be understood that filling of the trench 111 with the metal 215 may result in metal 215 deposition above the top level of the trench and possibly over the bulk dielectric material 107 present alongside the trench 111. In this case, a planarization process, such as a CMP process, can be performed to remove metal 215 that is deposited above the top level of the trench or over the bulk dielectric material 107 present alongside the trench 111. Additionally, it should be understood that other pre-processing or post-processing operations can be performed as part of or between any of the operations associated with the fabrication processes depicted in FIGS. 2A-2G, where such pre-processing or post-processing operations can include cleaning, rinsing, drying, among others.

As depicted in FIGS. 2A-2G, methods of the present invention provide for pre-filling of an opening in a dual damascene structure defined to form an interlevel conductor in an integrated circuit device, while preventing void formation within the interlevel conductor and while maintaining low electrical resistance through the interlevel conductor. The selective deposition of the sealing barrier 205 on the sidewall of the opening 109 prevents metal diffusion into the dielectric material 107 and leaves the underlying conductive material 105 exposed to initiate nucleation for electroless deposition of metal 207 within the opening 109, whereby the opening 109 is filled with the metal 207 in a substantially uniform bottom-to-top manner, thereby preventing formation of voids within the resulting interlevel conductor.

Also, because there is no barrier material 113 and liner material 115 at the bottom of the opening 109 to separate the metal 207 from the underlying conductive material 105, the electrical resistance through the transition from the underlying conductive material 105 to the metal 207 is substantially less when compared to having the barrier material 113 and the liner material 115 present at the bottom of the opening 109. Additionally, it should be appreciated that because of the relatively low aspect ratio of the trench 111 as compared to the opening 109, the barrier material 211 and liner material 213 layers that are deposited within the trench 111 over the opening 109, such as depicted in FIG. 2G, are thinner than the barrier material 113 and liner material 115, respectively, present at the bottom of the opening 109 in the configuration of FIG. 1D. More specifically, the barrier material 211 that is deposited over the top of the opening 109 in the configuration of FIG. 2G is thinner due to the ease of depositing the barrier material 211 in the larger area of the exposed trench 111 as compared to having to ensure that the barrier material 113 is deposited in a fully covering manner over the bottom and sidewalls inside the constricted opening 109 as shown in the configuration of FIG. 1D. The overall electrical resistance of the interlevel conductive structure in the configuration of FIG. 2G is up to 50% lower than that of the interlevel conductive structure present in the configuration of FIG. 1D.

Figure 3:
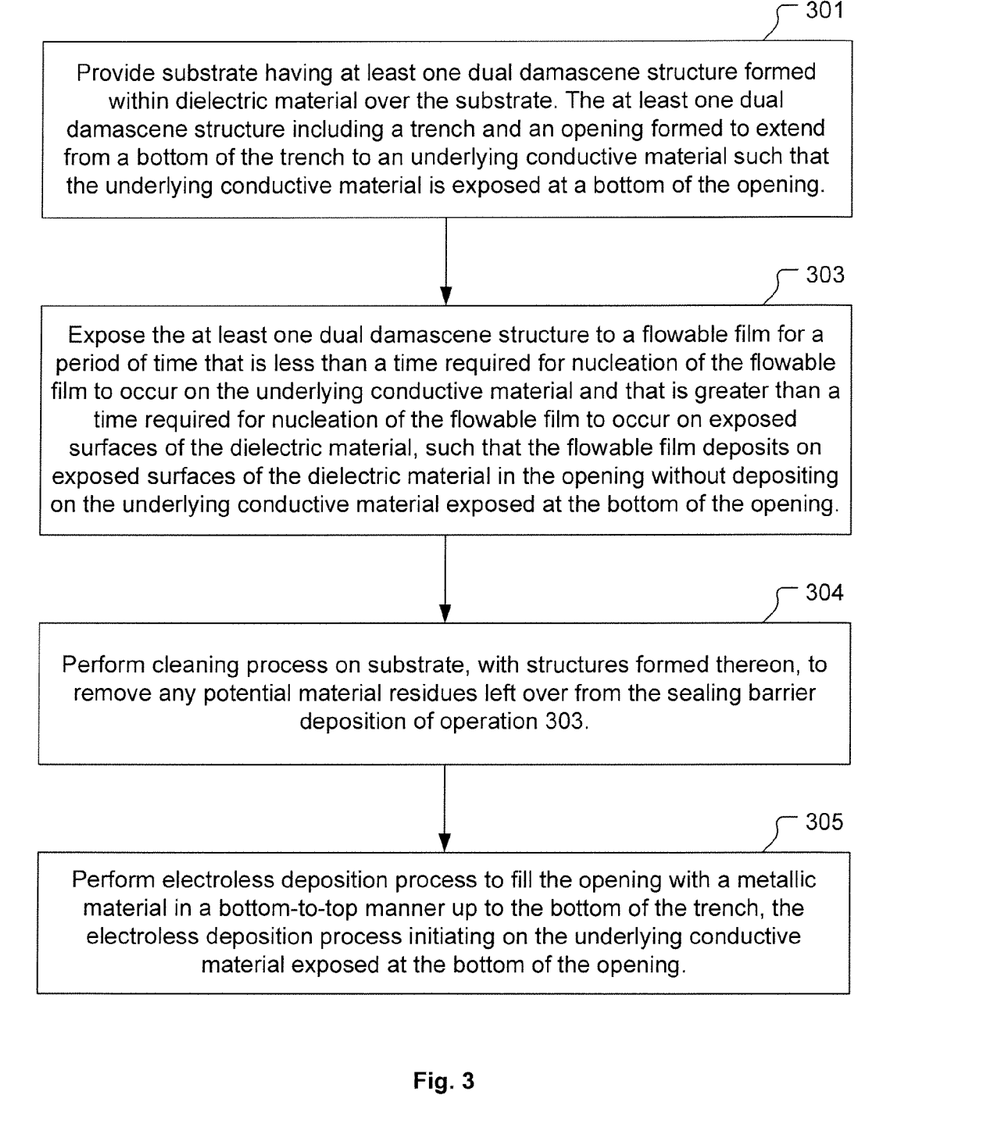
FIG. 3 shows a flowchart of a method for manufacturing a semiconductor device, in accordance with one embodiment of the present invention.

FIG. 3 shows a flowchart of a method for manufacturing a semiconductor device, in accordance with one embodiment of the present invention. The method includes an operation 301 for providing a substrate having at least one dual damascene structure formed within a dielectric material over the substrate. The at least one dual damascene structure includes a trench and an opening formed to extend from a bottom of the trench to an underlying conductive material such that the underlying conductive material is exposed at a bottom of the opening, such as previously described with regard to FIG. 2A. The method also includes an operation 303 for exposing the at least one dual damascene structure to a flowable film for a period of time that is less than a time required for nucleation of the flowable film to occur on the underlying conductive material and that is greater than a time required for nucleation of the flowable film to occur on exposed surfaces of the dielectric material. Operation 303 is performed such that the flowable film deposits on exposed surfaces of the dielectric material in the opening without depositing on the underlying conductive material exposed at the bottom of the opening. It should be understood that operation 303 is a process for depositing the sealing barrier 205 (by way of the flowable film) as previously discussed with regard to FIG. 2B. The operation 303 for exposing the at least one dual damascene structure to the flowable film can include deposition of a flowable silicon dioxide ($SiO_2$) film, a flowable silicon nitride (SiN) film, a flowable silicon carbide (SiC) film, a flowable silicon carbide nitride (SiCN) film, or other variations of carbon-containing material (C+N, C+B, etc.), or a combination thereof. Example processes for performing operation 303 to expose the at least one dual damascene structure to the flowable film are described in U.S. Patent Application No. US 2012/0149213 and U.S. Pat. No. 8,187,951, each of which is incorporated herein by reference in its entirety for all purposes.

Following the operation 303, an operation 304 is performed in which the substrate, with structures formed thereon, is subjected to a cleaning process to remove any potential material residues left over from the sealing barrier 205 deposition of operation 303. From the operation 304, the method continues with an operation 305 for performing an electroless deposition process to fill the opening with a metallic material in a bottom-to-top manner up to the bottom of the trench. In operation 305, the electroless deposition process initiates on the underlying conductive material exposed at the bottom of the opening. It should be understood that operation 305 is a process for filling the opening 109 with metal 207 as previously discussed with regard to FIGS. 2C and 2D.

In some embodiments, the method can include stopping of exposing the at least one dual damascene structure to the flowable film after the period of time in operation 303, and repeating exposure of the at least one dual damascene structure to the flowable film for the period of time prior to performing the electroless deposition process. In this manner, operation 303 can be performed in a cyclical manner so as to build up a sufficient thickness of the flowable film as the sealing barrier 205, without causing deposition of the flowable film on the underlying conductive material 105. In various embodiments, the flowable film is either a nitride film or a carbide film. In some embodiments, the flowable film is an oxide film.

Also, in some embodiments, prior to exposing the at least one dual damascene structure to the flowable film for the period of time, the method can include an operation for exposing the at least one dual damascene structure to a pre-treatment plasma to decrease the time required for nucleation of the flowable film to occur on exposed surfaces of the dielectric material. In some embodiments the pre-treatment plasma is formed from a pre-treatment process gas including one or more of a hydrogen-containing compound, a nitrogen-containing compound, and an oxygen-containing compound.

Also, in some embodiments, after exposing the at least one dual damascene structure to the flowable film for the period of time, the method can include performing a post-treatment process to affect a change in the flowable film that was deposited, where the change is one or more of densification, chemical conversion, and physical conversion. In some embodiments, the post-treatment process includes exposure of the flowable film that was deposited to one or more of an inert plasma, a reactive plasma, a thermal annealing process, and radiative energy, wherein the radiative energy is one or more of ultra-violet radiation, infra-red radiation, and microwave radiation.

Figure 4:
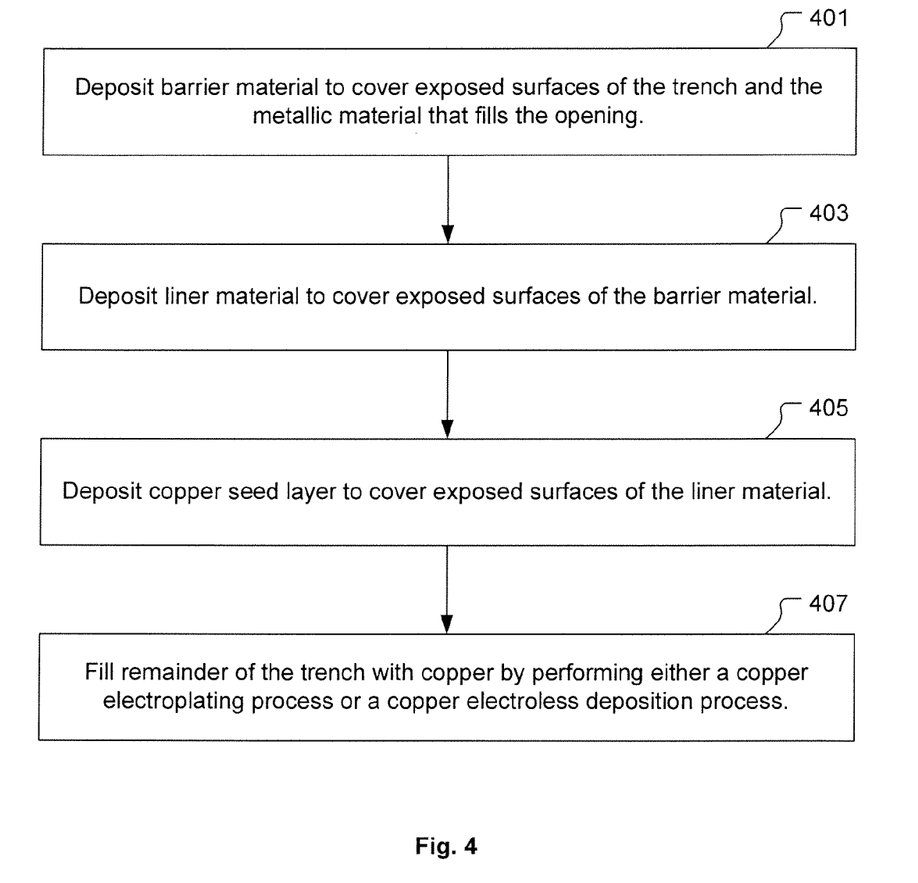
FIG. 4 shows a flowchart including operations for filling the trench, in accordance with one embodiment of the present invention.

Additionally, the method of FIG. 3 can be followed by the operations depicted in the flowchart of FIG. 4 so as to fill the trench, in accordance with one embodiment of the present invention. An operation 401 is performed to deposit a barrier material to cover exposed surfaces of the trench and the metallic material that fills the opening. Operation 401 is previously discussed with regard to FIG. 2E. Then, an operation 403 is performed to deposit a liner material to cover exposed surfaces of the barrier material. Operation 403 is previously discussed with regard to FIG. 2F. Then, an operation 405 is performed to deposit a copper seed layer to cover exposed surfaces of the liner material. Then, an operation 407 is performed to fill a remainder of the trench with copper by performing either a copper electroplating process or a copper electroless deposition process. Operations 405 and 407 are previously discussed with regard to FIG. 2G.

Figure 5:
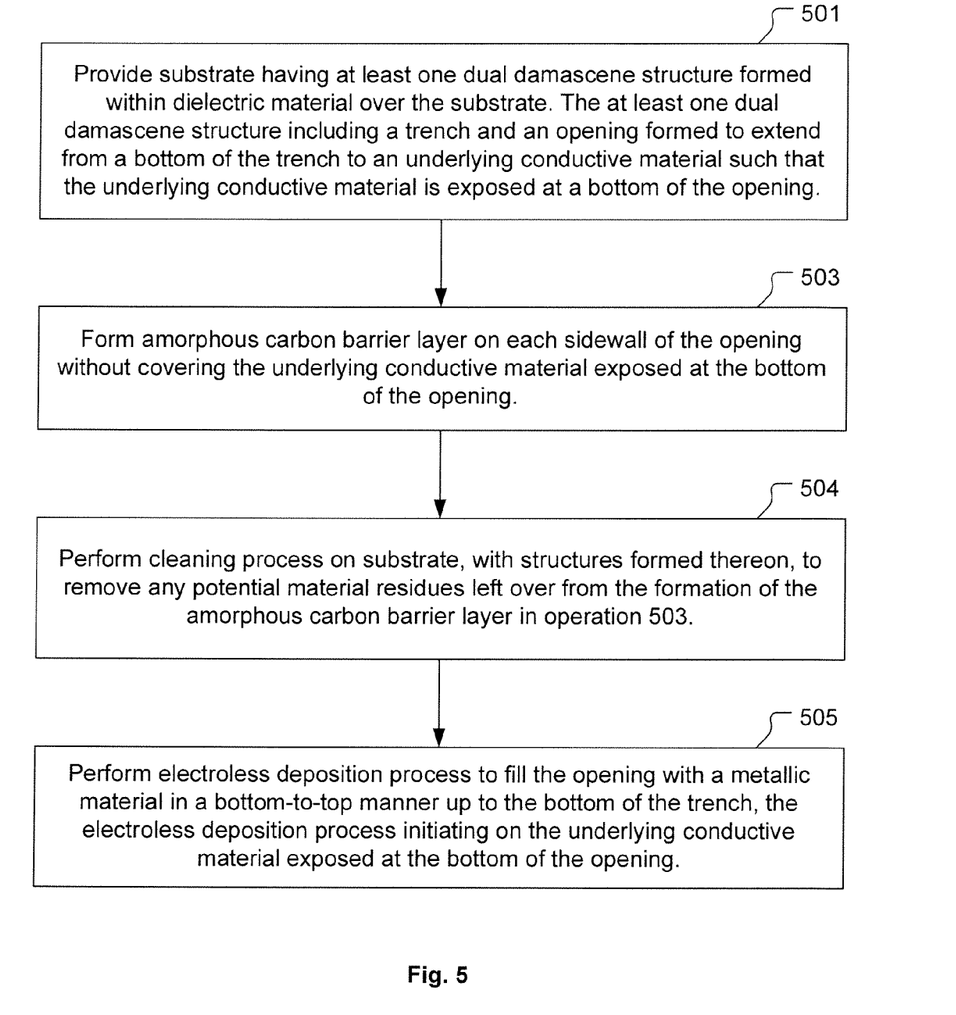
FIG. 5 shows a flowchart of a method for manufacturing a semiconductor device, in accordance with one embodiment of the present invention.

FIG. 5 shows a flowchart of a method for manufacturing a semiconductor device, in accordance with one embodiment of the present invention. The method includes an operation 501 for providing a substrate having at least one dual damascene structure formed within a dielectric material over the substrate. The at least one dual damascene structure includes a trench and an opening formed to extend from a bottom of the trench to an underlying conductive material such that the underlying conductive material is exposed at a bottom of the opening, such as previously described with regard to FIG. 2A. The method also includes an operation 503 for forming an amorphous carbon barrier layer on each sidewall of the opening without covering the underlying conductive material exposed at the bottom of the opening. It should be understood that operation 503 is a process for depositing the sealing barrier 205 as previously discussed with regard to FIG. 2B. Following the operation 503, an operation 504 is performed in which the substrate, with structures formed thereon, is subjected to a cleaning process to remove any potential material residues left over from the formation of the amorphous carbon barrier layer in operation 503. The method also includes an operation 505 for performing an electroless deposition process to fill the opening with a metallic material in a bottom-to-top manner up to the bottom of the trench. In operation 505, the electroless deposition process initiates on the underlying conductive material exposed at the bottom of the opening. It should be understood that operation 505 is a process for filling the opening 109 with metal 207 as previously discussed with regard to FIGS. 2C and 2D. Additionally, the method of FIG. 5 can be followed by the operations depicted in the flowchart of FIG. 4 so as to fill the trench.

The method of FIG. 5 can also include an operation for exposing the at least one dual damascene structure to a deposition plasma in order to form the amorphous carbon barrier layer on each sidewall of the opening in operation 503. In some embodiments, the deposition plasma is formed from a deposition gas that includes a hydrocarbon and an oxygen free inert diluent. Also, in some embodiments, the method of FIG. 5 can include exposing the amorphous carbon barrier layer to a conditioning plasma as part of forming the amorphous carbon barrier layer on each sidewall of the opening in operation 503. In some embodiments the conditioning plasma is formed from a conditioning gas that includes hydrogen and that is essentially free of any hydrocarbon compound. Example processes for performing operation 503 to form the amorphous carbon barrier layer on each sidewall of the opening are described in U.S. Pat. No. 8,524,329, which is incorporated herein by reference in its entirety for all purposes.

Figure 6:
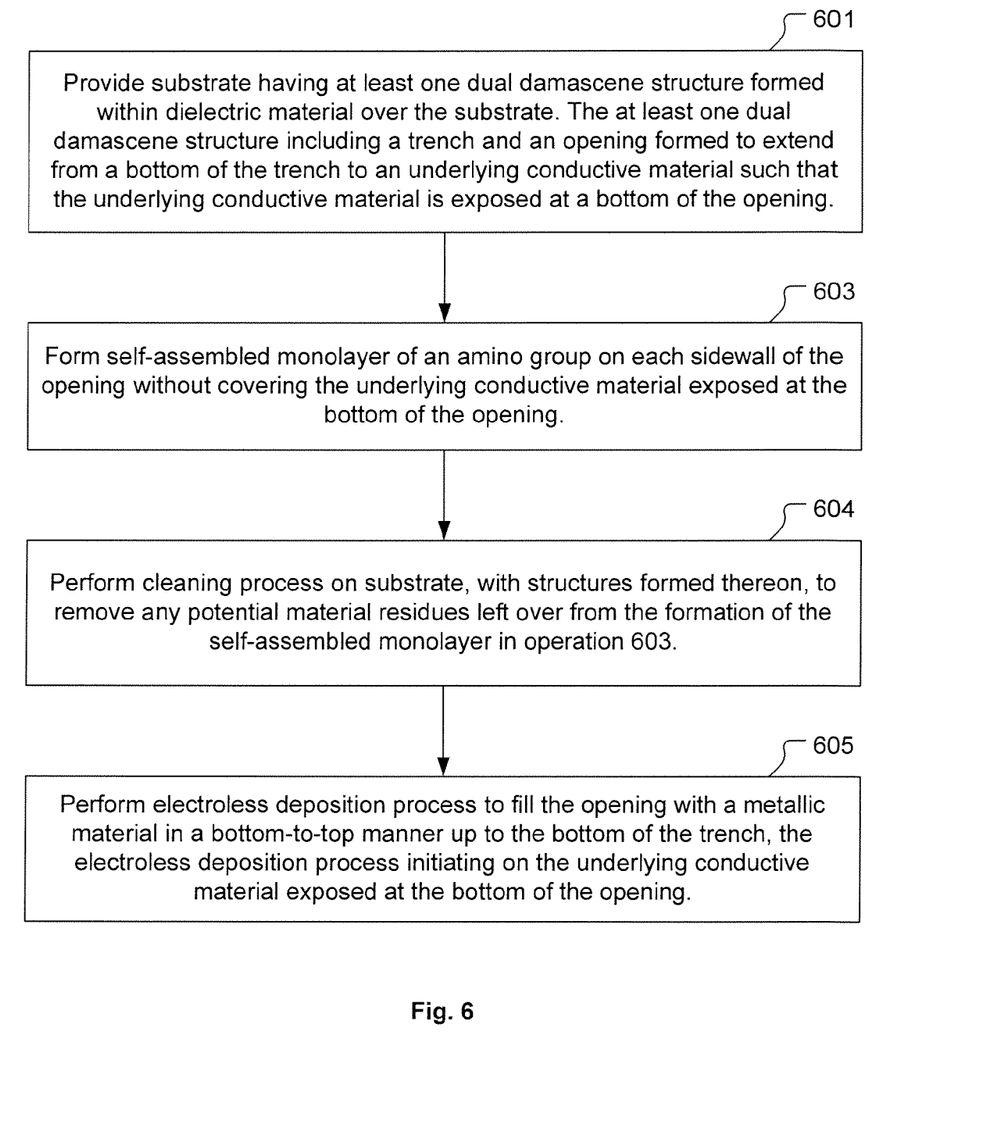
FIG. 6 shows a flowchart of a method for manufacturing a semiconductor device, in accordance with one embodiment of the present invention.

FIG. 6 shows a flowchart of a method for manufacturing a semiconductor device, in accordance with one embodiment of the present invention. The method includes an operation 601 for providing a substrate having at least one dual damascene structure formed within a dielectric material over the substrate. The at least one dual damascene structure includes a trench and an opening formed to extend from a bottom of the trench to an underlying conductive material such that the underlying conductive material is exposed at a bottom of the opening, such as previously described with regard to FIG. 2A. The method also includes an operation 603 for forming a self-assembled monolayer (SAM) of an amino group on each sidewall of the opening without covering the underlying conductive material exposed at the bottom of the opening. It should be understood that operation 603 is a process for depositing the sealing barrier 205 as previously discussed with regard to FIG. 2B. Following the operation 603, an operation 604 is performed in which the substrate, with structures formed thereon, is subjected to a cleaning process to remove any potential material residues left over from the formation of the SAM in operation 603. The method also includes an operation 605 for performing an electroless deposition process to fill the opening with a metallic material in a bottom-to-top manner up to the bottom of the trench. In operation 605, the electroless deposition process initiates on the underlying conductive material exposed at the bottom of the opening. It should be understood that operation 605 is a process for filling the opening 109 with metal 207 as previously discussed with regard to FIGS. 2C and 2D. Additionally, the method of FIG. 6 can be followed by the operations depicted in the flowchart of FIG. 4 so as to fill the trench.

In some embodiments, the self-assembled monolayer is formed of an amidogen radical ($NH_2$) in operation 603. Also, in some embodiments, forming the self-assembled monolayer of the amino group on each sidewall of the opening in operation 603 includes exposing the at least one dual damascene structure to fluid including 3-aminopropyltrimethoxysilane (APTMS). In some of these embodiments the fluid includes APTMS in toluene. Also, in some embodiments the fluid is in either a solution form or a vapor form. In some embodiments, the operation 603 includes exposing the at least one dual damascene structure to the fluid for a period of time sufficient to achieve a thickness of about 1 nanometer of the self-assembled monolayer on each sidewall of the opening.

In some embodiments, operation 603 includes forming an amino-terminated SAM barrier ($NH_2SAM$) to seal the dielectric material. The SAM barrier layer has a sub-nanometer scale thickness, and can be grafted onto substrates from either liquid or gas phase, and has high conformability to the substrate topography. For these reasons, deposition of the SAM barrier layer over the dielectric material provides an ultra-thin, high-quality, dense, and pinhole-free diffusion barrier layer for inhibiting metal (especially Cu) diffusion into the dielectric material. For SAM formed by chemical grafting, in some embodiments, the chemical-grafting molecules are adsorbed by physisorption and chemisorption from a solution (a wet process) onto solid substrates to bond with the surface and to form an ordered molecular functionalization layer, which is a self-assembled monolayer. In other embodiments, the chemically-grafted compound can also be applied to the substrate surface as a vapor (a dry process).

The SAM barrier is formed to have sufficiently high density so as to avoid pin holes in the SAM barrier. The thickness of the SAM barrier layer increases with increased deposition time. Also, the density of the SAM barrier layer increases with increased deposition time. Increasing the thickness and density of the SAM barrier layer provides for a decrease in capacitive current flow through the SAM barrier layer. As the thickness and density of the SAM layer increases, the capacitive current blocking efficiency of the SAM layer increases. Additionally, with increased SAM deposition time, the SAM modified surface becomes more hydrophobic. In some embodiments, the exposed dielectric surface can be essentially fully functionalized after 15 minutes of SAM deposition, with a resulting SAM layer thickness that is less than about 1 nanometer, and with a resulting SAM layer that is continuous and free of pinholes. Example processes for performing operation 603 to form the self-assembled monolayer of an amino group on each sidewall of the opening are described in "*High Quality NH₂SAM (Self Assembled Monolayer) Diffusion Barrier for Advanced Copper Interconnects*," by Arantxa Maestre Caro, Larry Zhao, Guido Maes, Gustaaf Borghs, Gerald Beyer, Zsolt Tokei, Silvia Armini, and Youssef Travaly, Mater. Res. Soc. Symp. Proc. Vol. 1249, Materials Research Society 2010, which is incorporated herein by reference in its entirety for all purposes.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for manufacturing a semiconductor device, comprising:
providing a substrate having at least one dual damascene structure formed within a dielectric material over the substrate, the at least one dual damascene structure including a trench and an opening formed to extend from a bottom of the trench to an underlying conductive material such that the underlying conductive material is exposed at a bottom of the opening;
forming a self-assembled monolayer of an amino group on each sidewall of the opening without covering the underlying conductive material exposed at the bottom of the opening;
performing a cleaning process on the substrate, with structures formed thereon, to remove material residues left over from formation of the self-assembled monolayer; and
performing an electroless deposition process to fill the opening with a metallic material in a bottom-to-top manner up to the bottom of the trench, wherein the electroless deposition process initiates on the underlying conductive material exposed at the bottom of the opening.

2. The method of claim 1, wherein the self-assembled monolayer is formed of an amidogen radical ($NH_2$).

3. The method of claim 2, wherein forming the self-assembled monolayer of the amino group on each sidewall of the opening includes exposing the at least one dual damascene structure to fluid including 3-aminopropyltrimethoxysilane (APTMS).

4. The method of claim 3, wherein the fluid includes APTMS in toluene, and wherein the fluid is in either a solution form or a vapor form.

5. The method of claim 3, wherein the at least one dual damascene structure is exposed to the fluid for a period of time sufficient to achieve a thickness of about 1 nanometer of the self-assembled monolayer on each sidewall of the opening.

6. The method of claim 1, wherein the dielectric material is a low-k dielectric material.

7. The method of claim 1, wherein a ratio of a height of the opening to a width of the opening defines an aspect ratio of the opening, and wherein the aspect ratio of the opening is within a range extending from 1 to 60.

8. The method of claim 1, wherein the opening is either cylindrically shaped or rectilinearly shaped.

9. The method of claim 1, wherein the self-assembled monolayer of the amino group selectively forms on the dielectric material without depositing on the underlying conductive material exposed at the bottom of the opening.

10. The method of claim 1, wherein the metallic material is one or more of cobalt, copper, and nickel.

11. The method of claim 1, wherein the underlying conductive material exposed at the bottom of the opening and the metallic material are a same material.

12. The method of claim 1, wherein the underlying conductive material exposed at the bottom of the opening and the metallic material are different materials.

13. The method of claim 1, wherein the self-assembled monolayer of the amino group prevents the metallic material from diffusing into the dielectric material.

14. The method of claim 1, further comprising:
depositing a barrier material to cover exposed surfaces of the trench and the metallic material that fills the opening;
depositing a liner material to cover exposed surfaces of the barrier material;
depositing a copper seed layer to cover exposed surfaces of the liner material; and
filling a remainder of the trench with copper by performing either a copper electroplating process or a copper electroless deposition process.

15. The method of claim 14, wherein the barrier material is tantalum nitride.

16. The method of claim 14, wherein the barrier material is deposited through a physical vapor deposition process or a chemical vapor deposition process or an atomic layer deposition process.

17. The method of claim 14, wherein the liner material is tantalum or cobalt or ruthenium.

18. The method of claim 14, wherein the liner material is deposited through a physical vapor deposition process or a chemical vapor deposition process.

19. The method of claim 14, further comprising:
performing a planarization process to remove copper deposited above a top level of the trench.

* * * * *